(12) United States Patent
Zhang

(10) Patent No.: US 10,230,375 B2
(45) Date of Patent: *Mar. 12, 2019

(54) CONFIGURABLE GATE ARRAY COMPRISING THREE-DIMENSIONAL PRINTED MEMORY

(71) Applicant: Guobiao Zhang, Corvallis, OR (US)

(72) Inventor: Guobiao Zhang, Corvallis, OR (US)

(73) Assignees: HangZhou HaiCun Information Technology Co., Ltd., HangZhou, ZheJiang (CN); Guobiao Zhang, Corvallis, OR (US)

(*) Notice: Subject to any disclaimer, the term of this patent is extended or adjusted under 35 U.S.C. 154(b) by 0 days.

This patent is subject to a terminal disclaimer.

(21) Appl. No.: 15/919,434

(22) Filed: Mar. 13, 2018

(65) Prior Publication Data

US 2018/0205380 A1     Jul. 19, 2018

Related U.S. Application Data

(63) Continuation of application No. 15/450,017, filed on Mar. 5, 2017, now Pat. No. 9,948,306.

(30) Foreign Application Priority Data

Mar. 5, 2016 (CN) .......................... 2016 1 0125731
Mar. 7, 2018 (CN) .......................... 2018 1 0188645

(51) Int. Cl.
*H03K 19/177*    (2006.01)
*G11C 5/02*    (2006.01)
*H03K 19/173*    (2006.01)

(52) U.S. Cl.
CPC .......... *H03K 19/1776* (2013.01); *G11C 5/02* (2013.01); *H03K 19/1737* (2013.01); *H03K 19/17728* (2013.01); *H03K 19/17744* (2013.01)

(58) Field of Classification Search
None
See application file for complete search history.

(56) References Cited

U.S. PATENT DOCUMENTS

| | | | |
|---|---|---|---|
| 4,870,302 A | 9/1989 | Freeman | |
| 5,046,038 A | 9/1991 | Briggs et al. | |
| 5,835,396 A | 11/1998 | Zhang | |
| 5,954,787 A | 9/1999 | Eun | |
| 7,472,149 B2 | 12/2008 | Endo | |
| 7,512,647 B2 | 3/2009 | Wilson et al. | |
| 8,564,070 B2 | 10/2013 | Zhang | |

(Continued)

OTHER PUBLICATIONS

Paul et al., "Reconfigurable Computing Using Content Addressable Memory for Improved Performance and Resource Usage", Design Automation Conference (DAC), pp. 786-791, 2008.

(Continued)

*Primary Examiner* — Crystal L Hammond

(57) ABSTRACT

The present invention discloses a configurable gate array comprising three-dimensional printed memory (3D-P). It comprises an array of configurable computing elements, an array of configurable logic elements and a plurality of configurable interconnects. Each configurable computing element can selectively realize a basic function in a math library. It comprises a plurality of 3D-P arrays storing the look-up tables (LUT) for the basic functions in the math library.

20 Claims, 7 Drawing Sheets

(56) References Cited

U.S. PATENT DOCUMENTS

| | | | |
|---|---|---|---|
| 9,207,910 B2 | 12/2015 | Azadet et al. | |
| 9,225,501 B2 | 12/2015 | Azadet | |
| 2009/0066365 A1* | 3/2009 | Solomon | G06F 17/5054 326/41 |
| 2010/0070942 A1* | 3/2010 | Madurawe | G06F 17/5068 716/128 |
| 2012/0256653 A1* | 10/2012 | Cordero | H03K 19/17796 326/16 |
| 2017/0220499 A1* | 8/2017 | Gray | G06F 13/36 |

OTHER PUBLICATIONS

Karam et al, "Emerging Trends in Design and Applications of Memory-Based Computing and Content-Addressable Memories", Proceedings of the IEEE, vol. 103, issue 8, pp. 1311-1330, 2015.

* cited by examiner

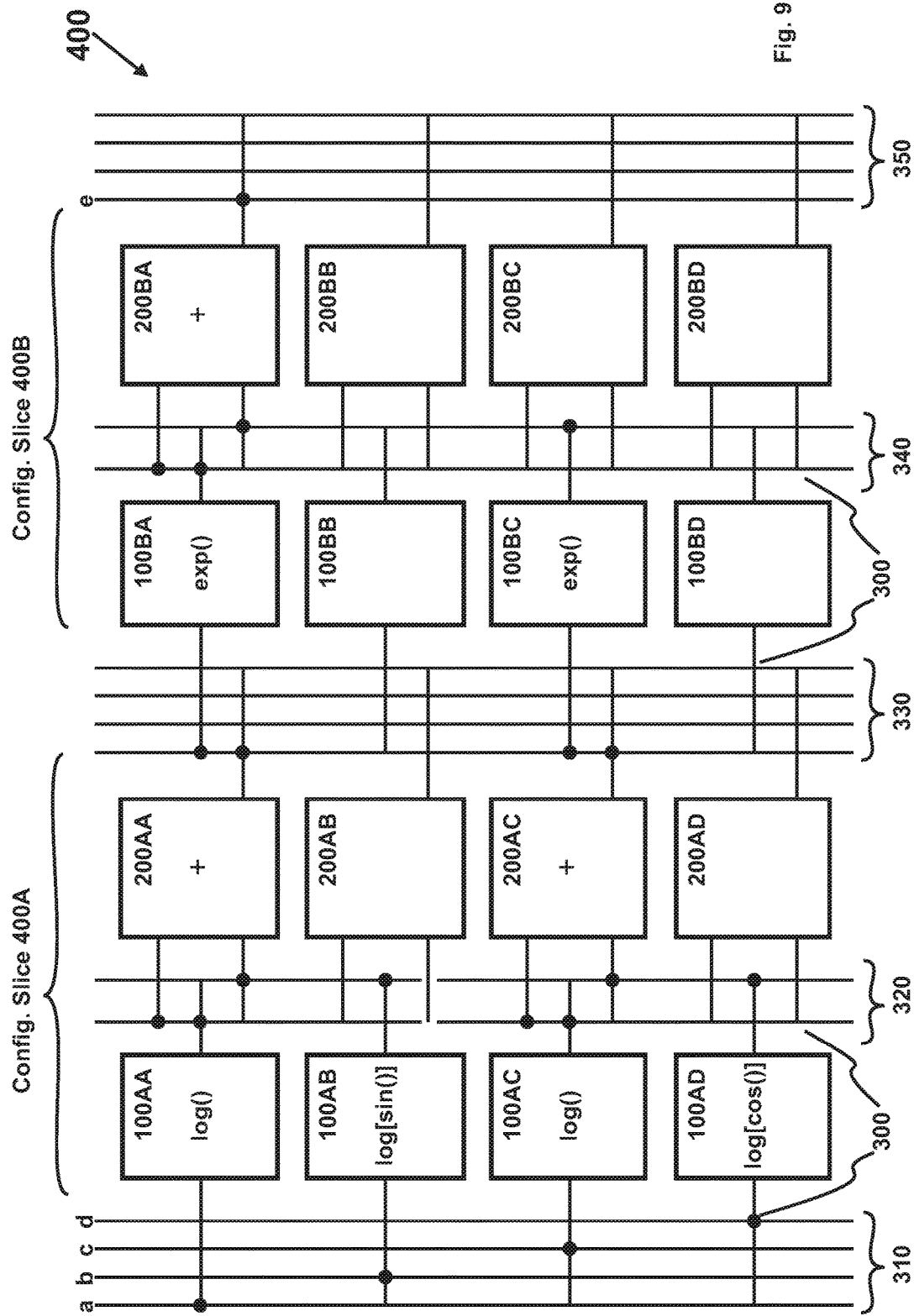

CONFIGURABLE GATE ARRAY COMPRISING THREE-DIMENSIONAL PRINTED MEMORY

CROSS-REFERENCE TO RELATED APPLICATIONS

This application is a continuation-in-part of "Configurable Gate Array Based on Three-Dimensional Printed Memory", application Ser. No. 15/450,017, filed Mar. 5, 2017, which claims priority from Chinese Patent Application 201610125731.8, filed on Mar. 5, 2016, in the State Intellectual Property Office of the People's Republic of China (CN), the disclosure of which is incorporated herein by reference in its entirety.

This application also claims priority from Chinese Patent Application 201810188645.0, filed Mar. 7, 2018, in the State Intellectual Property Office of the People's Republic of China (CN), the disclosure of which is incorporated herein by reference in its entirety.

BACKGROUND

1. Technical Field of the Invention

The present invention relates to the field of integrated circuit, and more particularly to configurable gate array.

2. Prior Art

A configurable gate array is a semi-custom integrated circuit designed to be configured by a customer after manufacturing. It includes field programmable gate array (FPGA) and mask-programmed gate array (MPGA). U.S. Pat. No. 4,870,302 issued to Freeman on Sep. 26, 1989 (hereinafter referred to as Freeman) discloses a configurable gate array—FPGA. It contains an array of configurable logic elements (also known as configurable logic blocks) and a hierarchy of configurable interconnects (also known as programmable interconnects) that allow the configurable logic elements to be wired together. Each configurable logic element in the array is in itself capable of realizing any one of a plurality of logic functions (e.g. shift, logic NOT, logic AND, logic OR, logic NOR, logic NAND, logic XOR, arithmetic addition "+", arithmetic subtraction "−", etc.) depending upon a first configuration signal. Each configurable interconnect can selectively couple or de-couple interconnect lines depending upon a second configuration signal.

Math functions are widely used in various applications. To meet the speed requirements, many high-performance applications require that these math functions be implemented in hardware. In conventional configurable gate arrays, math functions are implemented in fixed computing elements, which are part of hard blocks and not configurable, i.e. the circuits implementing these math functions are fixedly connected and are not subject to change by programming. Apparently, fixed computing elements would limit further applications of the configurable gate array. To overcome this difficulty, the present invention expands the original concept of the configurable gate array by making the fixed computing elements configurable. In other words, besides configurable logic elements, the configurable gate array comprises configurable computing elements, which can realize any one of a plurality of math functions.

OBJECTS AND ADVANTAGES

It is a principle object of the present invention to extend the applications of a configurable gate array to the field of complex math computation.

It is a further object of the present invention to provide a configurable gate array where not only logic functions can be customized, but also math functions.

It is a further object of the present invention to provide a configurable gate array with more computing power.

It is a further object of the present invention to provide a configurable gate array with smaller die size and lower die cost.

In accordance with these and other objects of the present invention, the present invention discloses a configurable gate array comprising three-dimensional printed memory (3D-P).

SUMMARY OF THE INVENTION

The present invention discloses a configurable gate array comprising three-dimensional printed memory (3D-P). It is a monolithic die and comprises at least an array of configurable computing elements, an array of configurable logic elements and a plurality of configurable interconnects. Each configurable computing element can selectively realize a math function from a math library. The math functions in the math library are generally referred to as basic functions and include functions such as exp, log, sin, cos, tan, atan, sqrt, cbrt. Each configurable computing element comprises a plurality of 3D-P arrays storing the look-up tables (LUT) for the basic functions. It further comprises at least a internal configurable interconnect. Through the internal configurable interconnect, the value of a desired basic function is read out from a selected LUT.

For high-performance computing, 3D-P is particularly suitable for storing LUT. 3D-P is a type of three-dimensional memory (3D-M) whose data are recorded using a printing method (e.g. photo-lithography, nano-imprint) during manufacturing. These data are fixedly recorded and cannot be changed after manufacturing. Because it does not need to support electrical programming, a 3D-P cell can be biased at larger voltage and current during read than a three-dimensional writable memory (3D-W) cell. As a result, 3D-P has a faster read speed than 3D-W.

Besides configurable computing elements, the preferred configurable gate array further comprises configurable logic elements and configurable interconnects. During computation, a complex math function is first decomposed into a number of basic functions. Each basic function is then realized by an associated configurable computing element. Finally, the complex math function is realized by programming the corresponding configurable logic elements and configurable interconnects. As used herein, complex math function is a combination of basic functions.

Using 3D-P for configurable computing element offers many advantages. First of all, because it is faster than 3D-W, 3D-P can be used to realize high-performance computing elements. Secondly, the 3D-P arrays storing the LUTs for different basic functions either have the same size, or differ by an integral multiple. The 3D-P arrays for different basic functions can be arranged in different memory levels and vertically stacked within a same 3D-M block. This would save substantial die area. Thirdly, because the 3D-P array does not occupy any substrate area, configurable logic elements and/or configurable interconnects can be formed underneath the 3D-P arrays. This would further save die area.

Accordingly, the present invention discloses a configurable computing element, comprising: a semiconductor substrate including transistors thereon; at least first and second three-dimensional printed memory (3D-P) arrays stacked above said semiconductor substrate, wherein said first 3D-P array stores at least a first portion of a first look-up table (LUT) for a first basic function, and said second 3D-P array stores at least a second portion of a second LUT for a second basic function; at least an internal configurable interconnect coupling with said first and second 3D-P arrays, wherein said configurable computing element selectively realizes said first or second basic function depending upon at least a configuration signal on said internal configurable interconnect.

The present invention further discloses a configurable gate array, comprising: an array of configurable computing elements comprising at least a configurable computing element, wherein said configurable computing element selectively realizes a basic function in a math library; an array of configurable logic elements comprising at least a configurable logic element, wherein said configurable logic element selectively realizes a logic function in a logic library; a plurality of configurable interconnects coupling said array of configurable computing elements and said array of configurable logic elements; wherein said configurable gate array realizes a math function by programming said array of configurable computing elements, said array of configurable logic elements and said plurality of configurable interconnects.

BRIEF DESCRIPTION OF THE DRAWINGS

FIG. 5A is its cross-sectional view; FIG. 5B is its substrate layout view;

FIG. 9 discloses a preferred configurable gate array implementing a complex math function.

Figure 1:
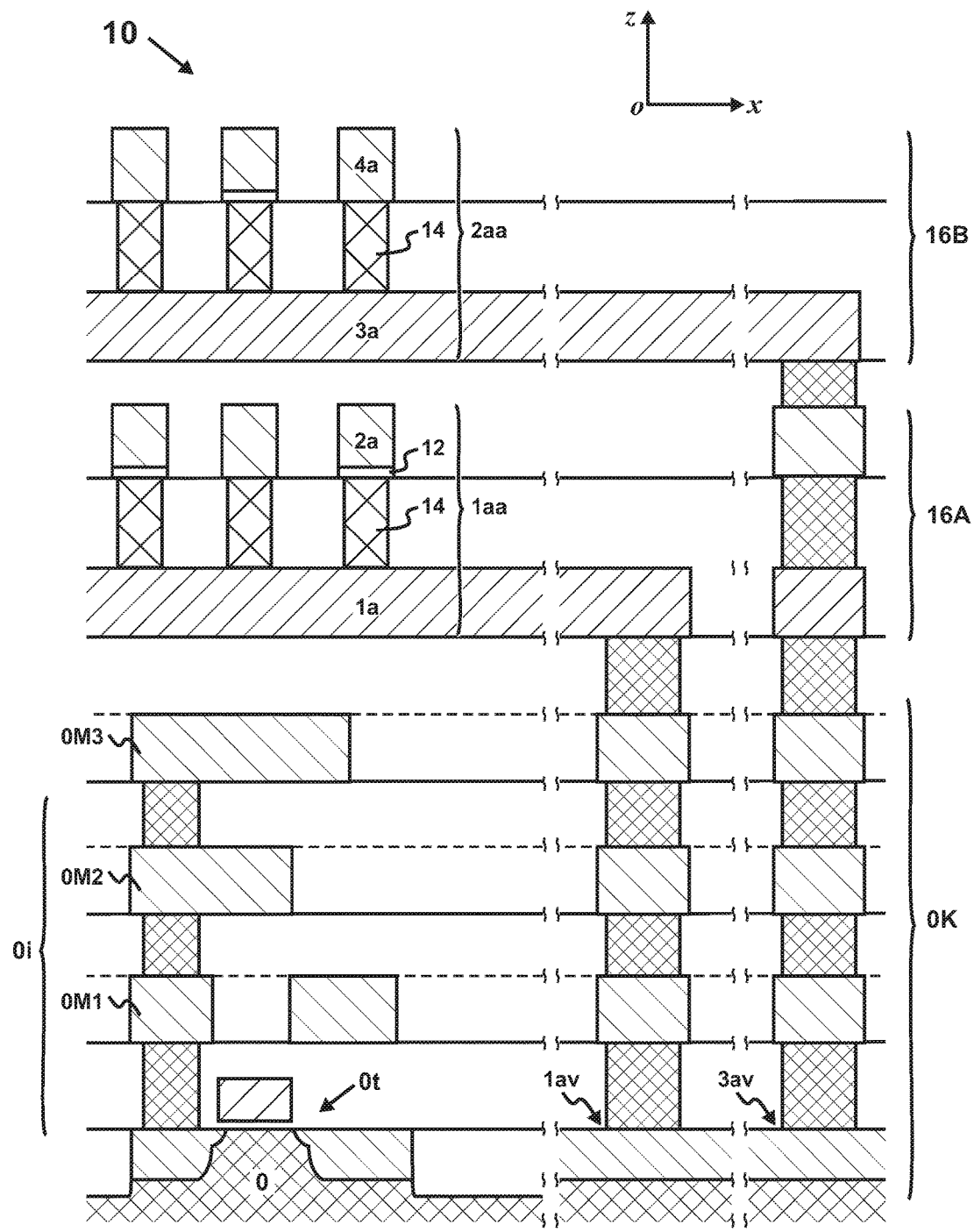
FIG. 1 is a cross-sectional view of a three-dimensional printed memory (3D-P)

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

Referring now to FIG. 1, a preferred three-dimensional printed memory (3D-P) 10 is shown. 3D-P is a type of three-dimensional memory (3D-M) whose data are recorded using a printing method during manufacturing. These data are fixedly recorded and cannot be changed after manufacturing. The printing methods include photo-lithography, nano-imprint, e-beam lithography, DUV lithography, and laser-programming, etc. A common 3D-P is three-dimensional mask-programmed read-only memory (3D-MPROM), whose data are recorded by photo-lithography.

The 3D-P 10 comprises a substrate circuit 0K formed on the substrate 0. A first memory level 16A is stacked above the substrate circuit 0K, with a second memory level 16B stacked above the first memory level 16A. The substrate circuit 0K includes the peripheral circuits of the memory levels 16A, 16B. It comprises transistors 0t and the associated interconnect 0i (including 0M1-0M2). Each of the memory levels (e.g. 16A, 16B) comprises a plurality of first address-lines (i.e. y-lines, e.g. 2a, 4a), a plurality of second address-lines (i.e. x-lines, e.g. 1a, 3a) and a plurality of 3D-P cells (e.g. 1aa, 2aa). The first and second memory levels 16A, 16B are coupled to the substrate circuit 0K through contact vias 1av, 3av, respectively.

In a 3D-P, each memory level comprises at least a 3D-P array. A 3D-P array is a collection of 3D-P cells in a memory level that share at least one address-line. Within a single 3D-P array, all address-lines are continuous; between adjacent 3D-P arrays, address-lines are not continuous. On the other hand, a 3D-P die comprises a plurality of 3D-P blocks. Each 3D-P block includes all memory levels in a 3D-P and its topmost memory level only comprises a single 3D-P array, whose projection on the substrate defines the boundary of the 3D-P block.

3D-P has at least two types of 3D-P cells 1aa, 2aa. The 3D-P cell comprises a diode 14. A diode is broadly interpreted as any two-terminal device whose resistance at the read voltage is substantially lower than when the applied voltage has a magnitude smaller than or polarity opposite to that of the read voltage. The diode could be a semiconductor diode (e.g. p-i-n silicon diode), or a metal-oxide (e.g. $TiO_2$) diode. Comprising a high-resistance layer 12, the 3D-P cell 1aa has a higher resistance than the 3D-P 2aa. As an example, the high-resistance layer 12 could be a layer of silicon oxide (SiO2). This high-resistance layer 12 is physically removed at the location of the 3D-P cell 2aa during manufacturing.

As its data are recorded during manufacturing and cannot be changed, 3D-P does not need to support electrical programming. In contrast, a three-dimensional writable memory (3D-W) needs to support electrical programming. Because the read voltage/current of a 3D-W cell has to smaller than its programming voltage/current, the read voltage/current of a 3D-W cell is smaller than that of a 3D-P cell and therefore, the read access of 3D-W is slower than 3D-P. Thus, 3D-P is better suited for high-performance computing.

Figure 2:
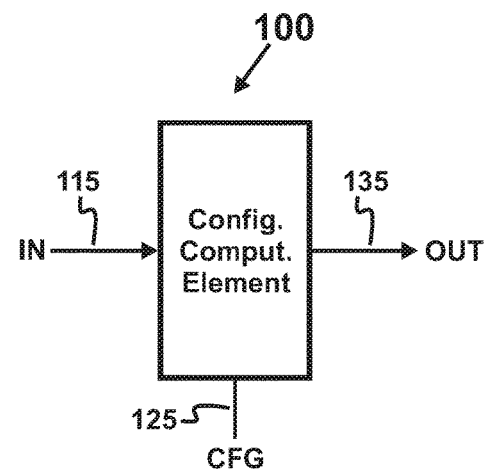
FIG. 2 discloses a symbol for a preferred configurable computing element.

FIG. 2 discloses a symbol for a preferred configurable computing element 100. The input port IN includes input data 115, the output port OUT includes output data 135, and the configuration port CFG includes at least a configuration signal 125. The configurable computing element 100 can selectively realize a math function from a math library depending on the configuration signal 125.

Figure 3:
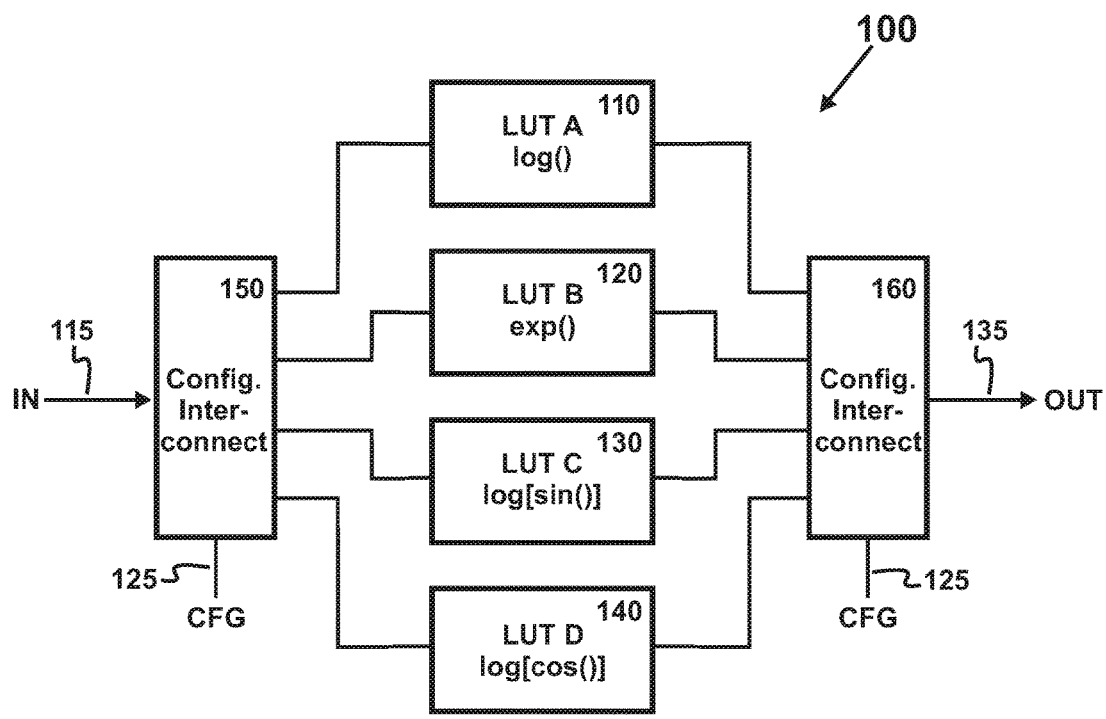
FIG. 3 is a circuit block diagram of a preferred configurable computing element. It also discloses a math library supported by the preferred configurable computing element.

Referring now to FIG. 3, a circuit block diagram of a preferred configurable computing element 100 as well a math library supported hereby is disclosed. It comprises first and second internal configurable interconnects 150,160 and a plurality of 3D-P arrays 110-140 storing the LUTs A-D for the math library. In this preferred embodiment, the first internal configurable interconnect 150 is a 1-to-4 demultiplexer, the second internal configurable interconnect 160 is a 4-to-1 multiplexer, and the math library has four math functions, including log( ), exp( ), log[sin( )], log[cos( )]. The 3D-P array 110 stores the LUT A of log( ); the 3D-P array 120 stores the LUT B 120 of exp( ); the 3D-P array 130 stores the LUT C 130 of log[sin( )]; and the 3D-P array 140 stores the LUT D of log[cos( )]. To realize, for instance, a basic function exp( ) from the math library, the first internal configurable interconnect 150 is configured in such a way that the input data 115 is sent to the 3D-P array 120, which is used as an address to read the value of exp( ) from the LUT B; and the second internal configurable interconnect 160 is configured in such a way that the read-out value from the LUT B is sent out as the output data 135. It should be apparent to those skilled in the art that the math library could support more basic functions. For example, it could have eight math functions, including log( ), exp( ), sin( ), cos( ), sqrt( ), cbrt( ), tan( ), atan( ). Other combinations are also possible.

Figure 4:
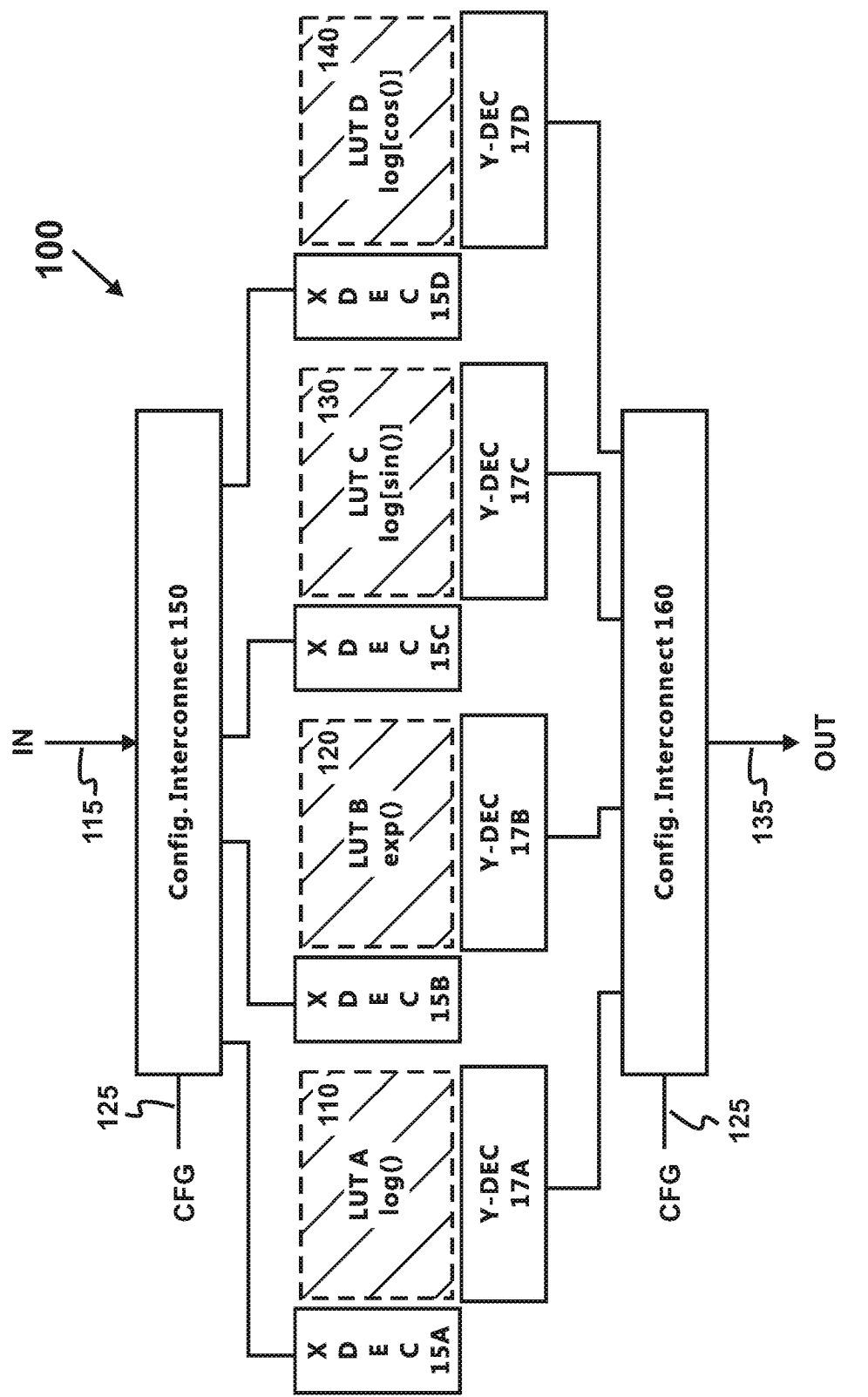
FIG. 4 is a substrate layout view of a first implementation of the preferred configurable computing element. It also shows a math library supported by this preferred configurable computing element.

FIG. 4 discloses a first implementation of the preferred configurable computing element 100. This is a layout view of its substrate circuit 0K. Because the 3D-P arrays 110-140 are stacked above the substrate 0K but not located in the substrate 0, their projections on the substrate 0, not the 3D-P arrays themselves, are shown in the areas enclosed by dash lines. In this preferred embodiment, each LUT is stored in a 3D-P array: the LUT A is stored in the 3D-P array 110, the LUT B is stored in the 3D-P array 120, the LUT C is stored in the 3D-P array 130, and the LUT D is stored in the 3D-P array 140. These 3D-P arrays 110-140 are placed side-by-side on the substrate 0. The substrate circuit 0K includes the internal configurable interconnects 150, 160 and the decoders for the 3D-P arrays 110-140. For example, the X decoder 15A and Y decoder (including read-out circuit) 17A for the 3D-P array 110.

Figure 5A:
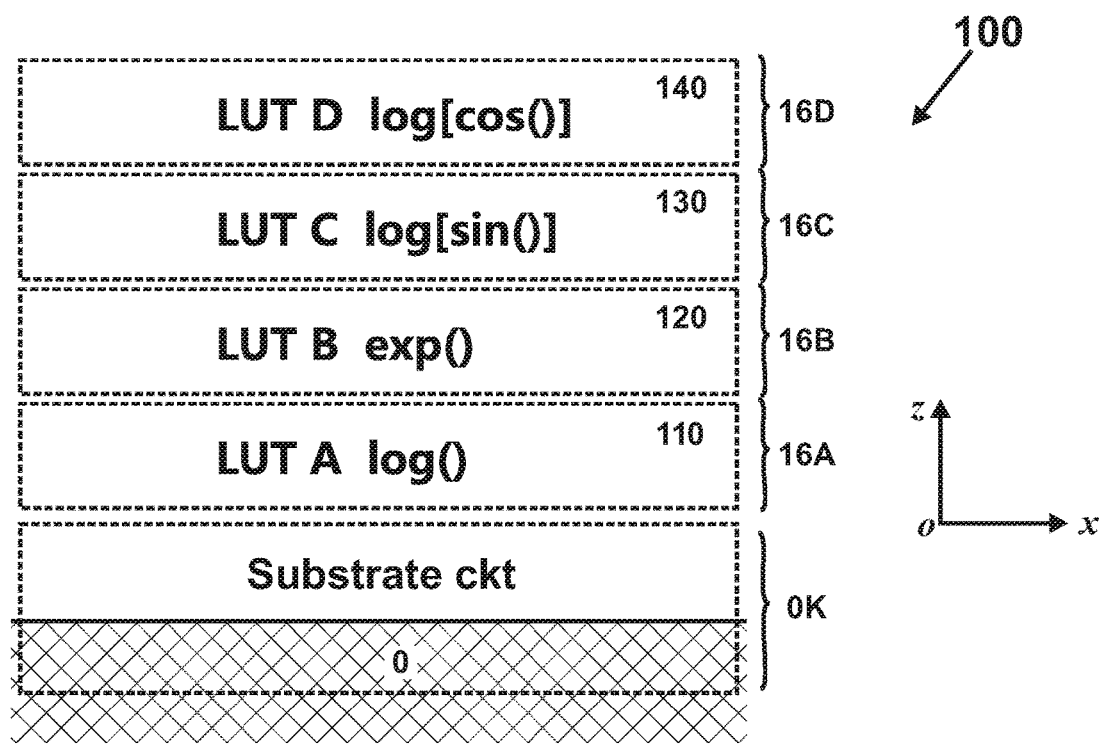
FIGS. 5A-5B disclose a second implementation of the preferred configurable computing element.
Figure 5B:
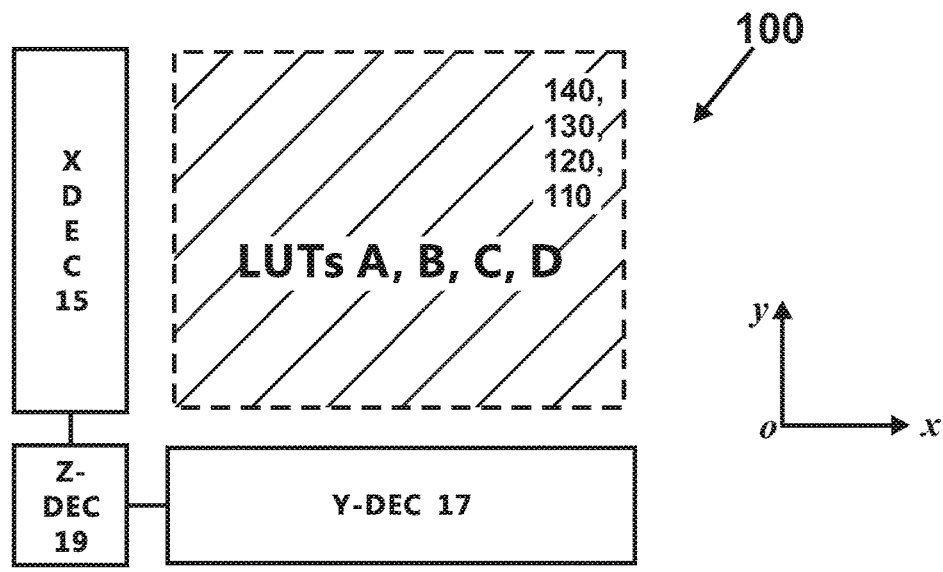

To minimize the substrate area occupied by the configurable computing element 100, the 3D-P arrays 110-140 storing the LUTs for different basic functions are vertically stacked. FIGS. 5A-5B discloses a second implementation of the preferred configurable computing element 100. In the cross-sectional view of the preferred embodiment (FIG. 5A), the 3D-P array 110 (storing LUT A for the function log( )) is stacked above the substrate 0K (along the +Z direction), the 3D-P array 120 (storing LUT B for the function exp( )) is stacked above the 3D-P array 110 (along the +Z direction), the 3D-P array 130 (storing LUT C for the function log[sin( )]) is stacked above the 3D-P array 120 (along the +Z direction), and the 3D-P array 140 (storing LUT D for the function log[cos( )]) is stacked above the 3D-P array 130 (along the +Z direction). This arrangement becomes more apparent in the substrate layout view of FIG. 5B. The projections of the 3D-P arrays 110-140 (storing the LUTs A-D) overlap each other on the substrate 0. The substrate area occupied by this preferred embodiment is only ~¼ of that of FIG. 4. Here, Z decoder 19 is, in fact, the internal configurable interconnects 150,160.

Figure 6:
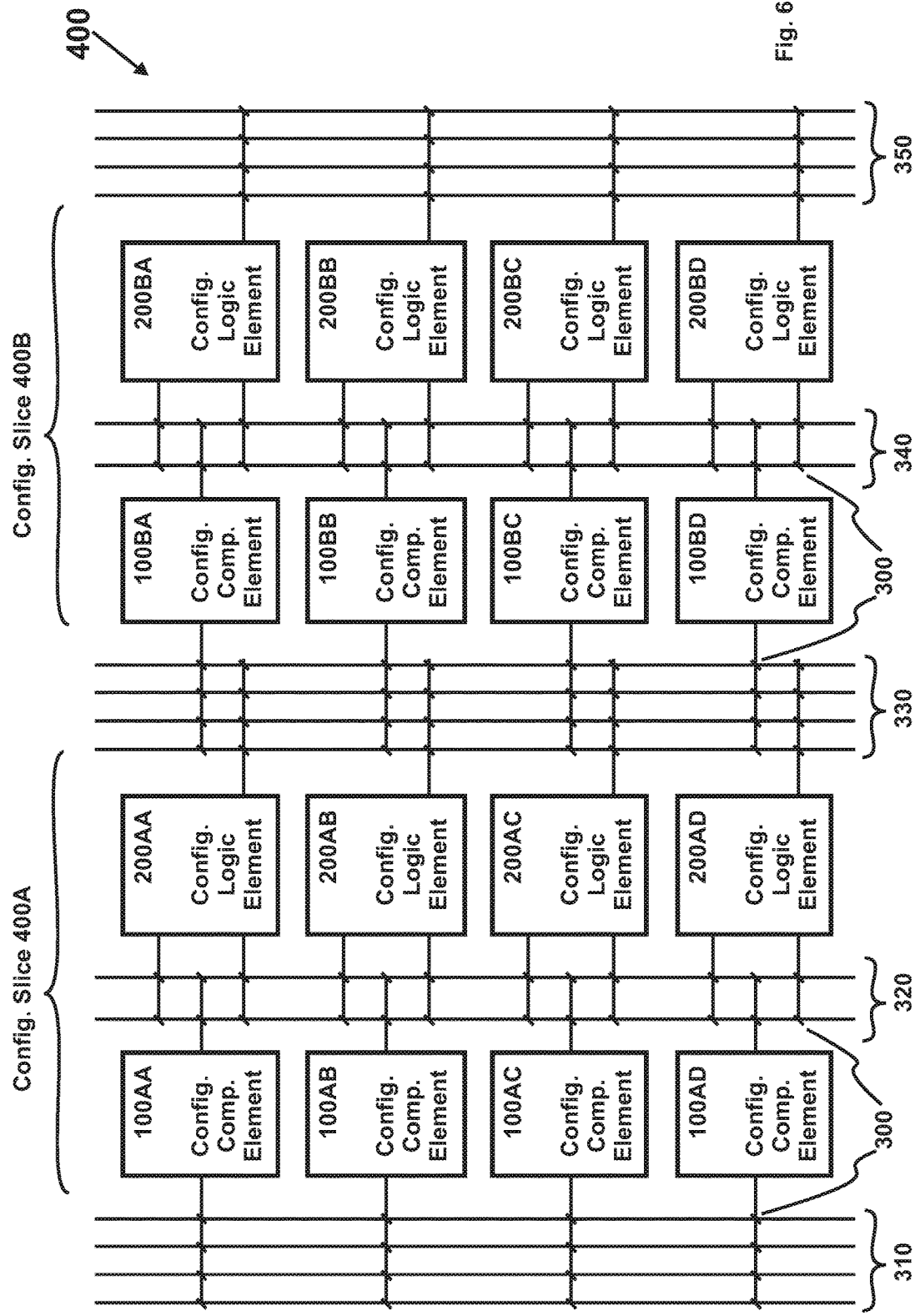
FIG. 6 discloses a preferred configurable gate array.

Referring now to FIG. 6, a preferred configurable gate array 400 is disclosed. It comprises at least first and second configurable slices 400A, 400B. Each configurable slice (e.g. 400A) comprises a first array of configurable computing elements (e.g. 100AA-100AD) and a second array of configurable logic elements (e.g. 200AA-200AD). A configurable channel 320 is placed between the first array of configurable computing elements (e.g. 100AA-100AD) and the second array of configurable logic elements (e.g. 200AA-200AD). The configurable channels 310, 330, 350 are also placed between different configurable slices 300A, 300B. The configurable channels 310-350 comprise a plurality of configurable interconnects 300. For those skilled in the art, besides configurable channels, sea-of-gates may also be used. In some embodiments, the preferred configurable gate array 400 further comprises at least a multiplier, which is coupled with selected configurable computing elements and/or selected configurable logic elements through a set of configurable interconnects. This multiplier performs multiplication between two variables.

Figure 7A:
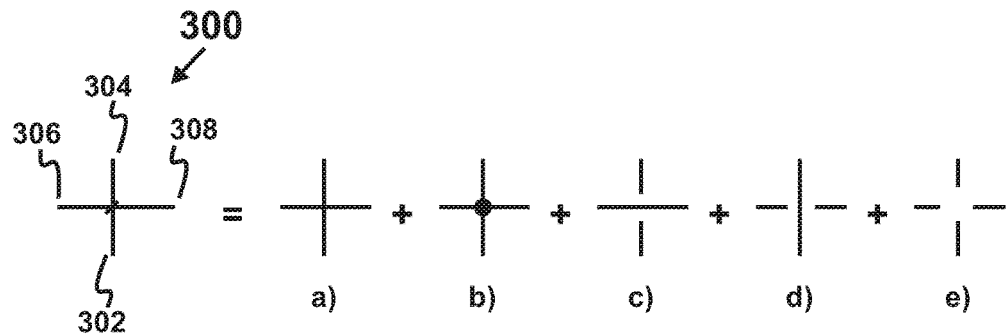
FIG. 7A shows an interconnect library supported by a preferred configurable interconnect.

FIG. 7A shows an interconnect library supported by a preferred configurable interconnect 300. An interconnect library is a collection of all interconnects supported by a configurable interconnect. This interconnect library includes the followings: a) the interconnects 302/304 are coupled, the interconnects 306/308 are coupled, but 302/304 are not connected with 306/308; b) the interconnects 302/304/306/308 are all coupled; c) the interconnects 306/308 are coupled, but the interconnects 302, 304 are not coupled, neither are 302, 304 connected with 306/308; d) the interconnects 302/304 are coupled, but the interconnects 306, 308 are not coupled, neither are 306, 308 connected with 302/304; e) interconnects 302, 304, 306, 308 are not coupled at all. As used herein, the symbol "/" between two interconnects means that these two interconnects are coupled, while the symbol "," between two interconnects means that these two interconnects are not coupled. More details on the configurable interconnects are disclosed in Freeman.

Figure 7B:
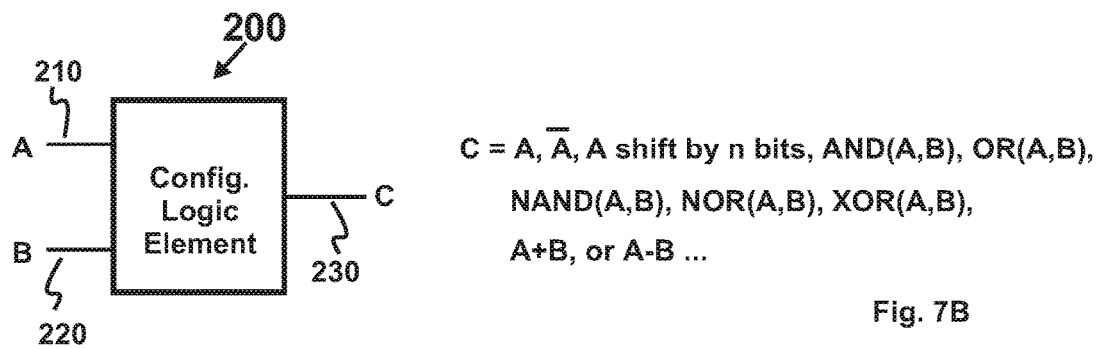
FIG. 7B shows a logic library supported by a preferred configurable logic element.

FIG. 7B shows a logic library supported by a preferred configurable logic element 200. A logic library is a collection of all logic functions supported by a configurable logic element. In this preferred embodiment, the inputs A and B are input data 210, 200, and the output C is the output data 230, the logic library includes the followings: C=A, NOT A, A shift by n bits, AND(A,B), OR(A,B), NAND(A,B), NOR(A,B), XOR(A,B), A+B, A−B. To facilitate pipelining, the configurable logic element 200 may comprise sequential logic such as flip-flops and registers. More details on the configurable logic elements are disclosed in Freeman.

Figure 8:
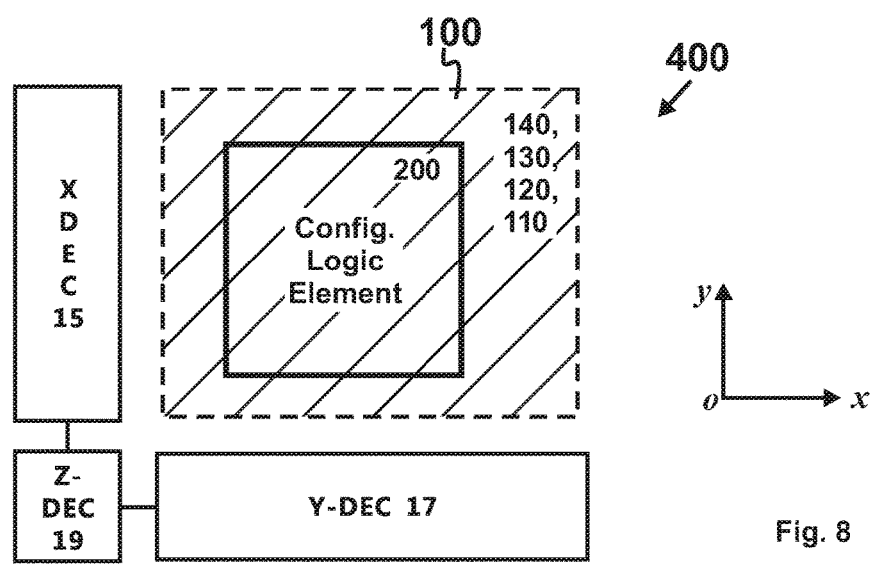
FIG. 8 is a substrate layout view of a third implementation of the preferred configurable computing element.

Referring now to FIG. 8, a third implementation of the preferred configurable computing element 100 is shown. Because the 3D-P arrays 110-140 do not occupy any substrate area, the configurable logic elements 200 and/or the configurable interconnects 300 can be formed underneath the 3D-P arrays 110-140 and at least partially covered by the 3D-P arrays 110-140. This can further minimize the die size of the configurable gate array 400.

Referring now to FIG. 9, a preferred configurable gate array implementing a complex math function e=a·sin(b)+c·cos(d) is disclosed. The configurable interconnects 300 in the configurable channel 310-350 use the same convention as FIG. 7A: the interconnects with dots at the intersection mean that the interconnects are connected; the interconnects without dots at the intersection mean that the interconnects are not connected; a broken interconnect means that two broken sections are two un-coupled interconnect lines. In this preferred implementation, the configurable computing element 100AA is configured to realize the function log( ), whose result log(a) is sent to a first input of the configurable logic element 200A. The configurable computing element 100AB is configured to realize the function log[sin( )], whose result log[sin(b)] is sent to a second input of the configurable logic element 200A. The configurable logic element 200A is configured to realize arithmetic addition, whose result log(a)+log[sin(b)] is sent the configurable computing element 100BA. The configurable computing element 100BA is configured to realize the function exp( ), whose result exp{log(a)+log[sin(b)]}=a·sin(b) is sent to a first input of the configurable logic element 200BA. Similarly, through proper configuration, the results of the configurable computing elements 100AC, 100AD, the configurable logic elements 200AC, and the configurable computing element 100BC are sent to a second input of the configurable logic element 200BA. The configurable logic element 200BA is configured to realize arithmetic addition, whose result a·sin(b)+c·cos(d) is sent to the output e. Apparently, by changing its configuration, the configurable gate array 400 can realize other complex math functions.

The preferred embodiments disclosed in FIGS. 6 and 9 are field-programmable gate arrays (FPGA). In FPGA, the wafers are fully finished, i.e. all configurable computing elements, configurable logic elements and configurable interconnects are finished together. The functions of the FPGA are later defined in the field. The inventive concepts of the present invention can be easily extended to back-end programmable gate arrays. In the back-end programmable gate arrays, the wafers are half-finished, i.e. only the configurable computing elements and the configurable logic elements are finished, while the configurable interconnects are not. Once the chip functions are defined, the configurable channels 310-350 are customized by the back-end process.

While illustrative embodiments have been shown and described, it would be apparent to those skilled in the art that many more modifications than that have been mentioned above are possible without departing from the inventive concepts set forth therein. The invention, therefore, is not to be limited except in the spirit of the appended claims.

What is claimed is:

1. A configurable computing element, comprising:
a semiconductor substrate including transistors thereon;
at least first and second three-dimensional printed memory (3D-P) arrays stacked above said semiconductor substrate, wherein said first 3D-P array stores at least a first portion of a first look-up table (LUT) for a first basic function, and said second 3D-P array stores at least a second portion of a second LUT for a second basic function;
at least an internal configurable interconnect coupling with said first and second 3D-P arrays, wherein said configurable computing element selectively realizes said first or second basic function depending upon at least a configuration signal on said internal configurable interconnect.

2. The configurable computing element according to claim 1, wherein said first and second 3D-P arrays are placed side-by-side on said substrate.

3. The configurable computing element according to claim 1, wherein said second 3D-P array is stacked above said first 3D-P array.

4. The configurable computing element according to claim 3, wherein said second 3D-P array at least partially covers said first 3D-P array.

5. The configurable computing element according to claim 1, wherein data are recorded into said 3D-P using a printing method during manufacturing.

6. The configurable computing element according to claim 5, wherein said printing method is photo-lithography.

7. The configurable computing element according to claim 5, wherein said printing method is nano-imprint.

8. The configurable computing element according to claim 5, wherein said printing method is e-beam lithography.

9. The configurable computing element according to claim 5, wherein said printing method is DUV lithography.

10. The configurable computing element according to claim 5, wherein said printing method is laser-programming.

11. A configurable gate array, comprising:
an array of configurable computing elements comprising at least a configurable computing element, wherein said configurable computing element selectively realizes a basic function in a math library;
an array of configurable logic elements comprising at least a configurable logic element, wherein said configurable logic element selectively realizes a logic function from a logic library;
a plurality of configurable interconnects coupling said array of configurable computing elements and said array of configurable logic elements;
wherein said configurable gate array realizes a math function by programming said array of configurable computing elements, said array of configurable logic elements and said plurality of configurable interconnects.

12. The configurable gate array according to claim 11, wherein said configurable computing element comprises at least first and second three-dimensional printed memory (3D-P) arrays stacked above a semiconductor substrate, said first 3D-P array storing at least a first portion of a first look-up table (LUT) for a first math function from said math library, said second 3D-P array storing at least a second portion of a second LUT for a second math function from said math library.

13. The configurable gate array according to claim 12, wherein said first and second 3D-P arrays are placed side-by-side on said substrate.

14. The configurable gate array according to claim 12, wherein said second 3D-P array is stack above said first 3D-P array.

15. The configurable gate array according to claim 14, wherein said second 3D-P array at least partially covers said first 3D-P array.

16. The configurable gate array according to claim 12, wherein data are recorded into said 3D-P using a printing method during manufacturing.

17. The configurable gate array according to claim 11, wherein said first or second 3D-P array is stack above at least a selected one of said configurable logic elements.

18. The configurable gate array according to claim 17, wherein said first or second 3D-P array at least partially covers said selected one of said configurable logic elements.

19. The configurable gate array according to claim 11, wherein said first or second 3D-P array is stack above at least a selected one of said configurable interconnects.

20. The configurable gate array according to claim 19, wherein said first or second 3D-P array at least partially covers said selected one of said configurable interconnects.

* * * * *